United States Patent
Eilert et al.

(10) Patent No.: US 9,015,440 B2
(45) Date of Patent: Apr. 21, 2015

(54) AUTONOMOUS MEMORY SUBSYSTEM ARCHITECTURE

(75) Inventors: Sean Eilert, Penryn, CA (US); Mark Leinwander, Folsom, CA (US); Jared Hulbert, Shingle Springs, CA (US)

(73) Assignee: Micron Technology, Inc., Boise, ID (US)

(*) Notice: Subject to any disclaimer, the term of this patent is extended or adjusted under 35 U.S.C. 154(b) by 586 days.

(21) Appl. No.: 12/557,856

(22) Filed: Sep. 11, 2009

(65) Prior Publication Data

US 2011/0066796 A1   Mar. 17, 2011

(51) Int. Cl.
| | | |
|---|---|---|
| *G06F 12/00* | (2006.01) |
| *G06F 3/06* | (2006.01) |
| *G06F 12/02* | (2006.01) |
| *G06F 13/12* | (2006.01) |
| *G06F 13/16* | (2006.01) |
| *G06F 13/38* | (2006.01) |
| *G06F 17/30* | (2006.01) |
| *G06F 9/50* | (2006.01) |
| *G11C 7/00* | (2006.01) |
| *G11C 16/00* | (2006.01) |

(52) U.S. Cl.
CPC  *G06F 3/06* (2013.01); *G06F 12/00* (2013.01); *G06F 12/02* (2013.01); *G06F 13/12* (2013.01); *G06F 13/16* (2013.01); *G06F 13/38* (2013.01); *G06F 17/30* (2013.01); *G06F 9/50* (2013.01); *G11C 7/00* (2013.01); *G11C 16/00* (2013.01)

(58) Field of Classification Search
CPC ........................................ G06F 12/02
USPC .......................................... 711/163, 114, 165
See application file for complete search history.

(56) References Cited

U.S. PATENT DOCUMENTS

| | | | |
|---|---|---|---|
| 5,105,425 A * | 4/1992 | Brewer .................. | 714/6.13 |
| 5,754,948 A * | 5/1998 | Metze .................... | 455/41.2 |
| 6,101,620 A * | 8/2000 | Ranganathan .......... | 714/718 |
| 2002/0124137 A1* | 9/2002 | Ulrich et al. ........... | 711/113 |
| 2004/0117603 A1* | 6/2004 | Arimilli et al. ......... | 712/225 |
| 2007/0005922 A1* | 1/2007 | Swaminathan et al. ... | 711/167 |
| 2007/0088703 A1 | 4/2007 | Kasiolas et al. | |
| 2007/0136508 A1* | 6/2007 | Rieke et al. ............ | 711/103 |
| 2007/0233710 A1* | 10/2007 | Passey et al. .......... | 707/100 |
| 2010/0106890 A1* | 4/2010 | Lasser et al. .......... | 711/103 |

FOREIGN PATENT DOCUMENTS

| | | |
|---|---|---|
| CN | 1496511 A | 5/2004 |
| DE | 102010044529 A1 | 3/2011 |
| JP | 2011060278 A | 3/2011 |

OTHER PUBLICATIONS

"German Application Serial No. 10 2010 044 529.0-53, English translation of Office Action mailed Aug. 19, 2011", 7 pgs.
"Chinese Application Serial No. 201010226463.1, Office Action mailed Jan. 24, 2013", 21 pgs.

* cited by examiner

*Primary Examiner* — Larry Mackall
(74) *Attorney, Agent, or Firm* — Schwegman Lundberg & Woessner, P.A.

(57) ABSTRACT

An autonomous sub-system receives a database downloaded from a host controller. A controller monitors bus traffic and/or allocated resources in the subsystem and re-allocates resources based on the monitored results to dynamically improve system performance.

12 Claims, 3 Drawing Sheets

AUTONOMOUS MEMORY SUBSYSTEM ARCHITECTURE

BACKGROUND OF THE INVENTION

A problem for parallel, distributed systems is how to assign and manage memory resources. Memory is typically attached to a host processor using a shared bus where appropriate protocols are applied to enable coherency and consistency. In this strategy memory controller hardware on the processor core can observe the traffic on the common bus, then update or invalidate cache lines to reflect the operations performed by the other processors. A many-node multiprocessor system may also use "directory-based" coherence techniques to allow processor nodes to see memory traffic that relates to pages or cache lines on which they are working. These strategies become increasingly performance hampering and improvements in distributed systems are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
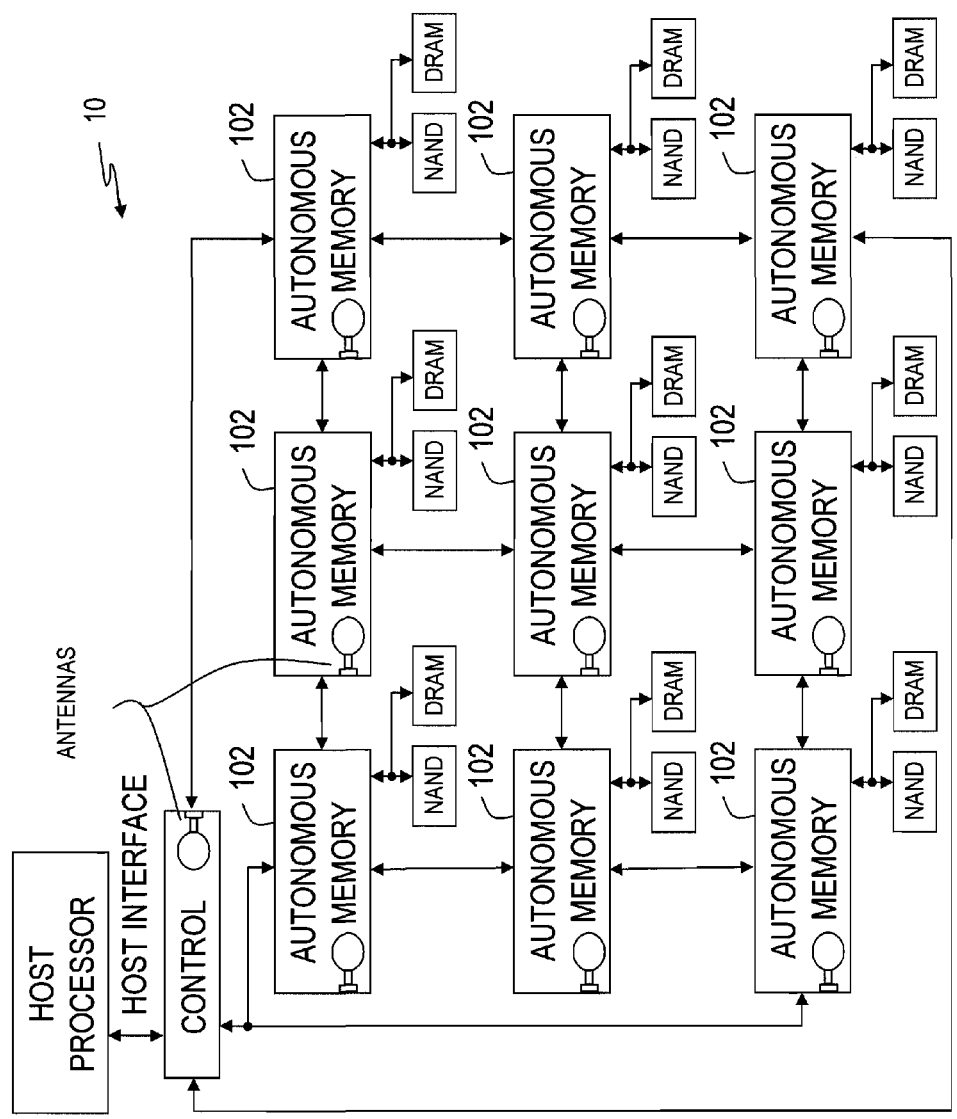
FIG. 1 illustrates an architecture that allows a processor to communicate with multiple autonomous memory devices configured in a distributed sub-system in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

The embodiment illustrated in FIG. 1 shows an architecture that enables a processor and multiple autonomous memory devices 102 to be configured for communicating in a distributed sub-system 10 in accordance with the present invention. In order to facilitate communication between a large number of devices, each of the autonomous memory devices 102 in distributed sub-system 10 is assigned their own address. This gives each autonomous memory device 102 the ability to route messages to other devices in the sub-system. Although the figure illustrates autonomous memory devices in a 3×3 array, distributed sub-system 10 may be configured having much larger numbers of devices in the network.

In one embodiment the addressing scheme may be absolute where each autonomous memory device 102 is assigned a unique static address as determined by a route to the autonomous memory device, e.g. the memory device may be specified as being on a particular port of the device and electrically connected to a port of the root device. In an alternative embodiment the address of the autonomous memory device may be dynamically determined while operating within the system. By allowing the address to be determined dynamically, the addressing scheme may be modified for purposes of optimization during system operation.

On system startup the network may initialize by transferring routing information to allow this inter-device communication to take place. Alternatively, the system may self-organize as autonomous memory devices 102 build a routing table using a scan technique to determine neighbors. The routing table keeps track of the devices within distributed sub-system 10 and may store parameters such as, for example, the latency cost based on location of any one device talking to another device.

The message passing on the bus that connects the distributed autonomous memory devices 102 may be modeled or it may be a standard network. One such standard network may be the Transmission Control Protocol/Internet Protocol (TCP/IP) that is responsible for verifying the correct delivery of data from one device to another. TCP/IP also provides support to detect errors or lost data that triggers retransmission until the data is verified as being correct and completely received. Another type of network that distributed sub-system 10 may employ is the InfiniBand architecture that creates a fabric to allow low latency communication, high bandwidth clustering, and storage traffic. Also, communication among autonomous memory devices 102 may use Ethernet in a frame based network.

The figure shows that different memory types may be attached to autonomous memory devices 102. As an example, each node of this autonomous memory may have NAND, DRAM or other volatile/nonvolatile combinations attached for 'offline' storage or scratchpad space. Also illustrated in the figure is a wireless architecture embodiment that shows memory devices 102 coupled to an antenna to transfer wireless signals. The antennas may be near-field loop antennas, capacitive plates, or dipole antennas that allow the radio associated with the memory device to program the memory arrays and download algorithms and databases by communicating using over-the-air communication signals. A configuration routing table tracks the memory devices to facilitate communications between devices within distributed sub-system 10.

The figure shows a wireless connection between the control block and the dice shown as the autonomous memory devices 102 in the memory subsystem. In this embodiment the control block monitors and reacts to congestion in traffic to the various blocks. Bus traffic is one aspect of a resource that may constrain system performance. To alleviate performance constraints, the monitor block may move portions of a database to a different die to parallelize searches or fully utilize computing resources. As such, the monitor block monitors constrained resources to optimize system performance, with bus traffic being just one example of a resource that may be optimized by relocation of data among memory devices 102.

In this embodiment the die-to-die wireless communication may use antennae that are physically located to only communicate with other dice that are in the same stack. To achieve inter-die wireless communication, each autonomous memory devices 102 would have antenna on input ports to receive signals and antennae on output ports to transmit signals. The wireless communication would minimize the need for bond wires.

Figure 2:
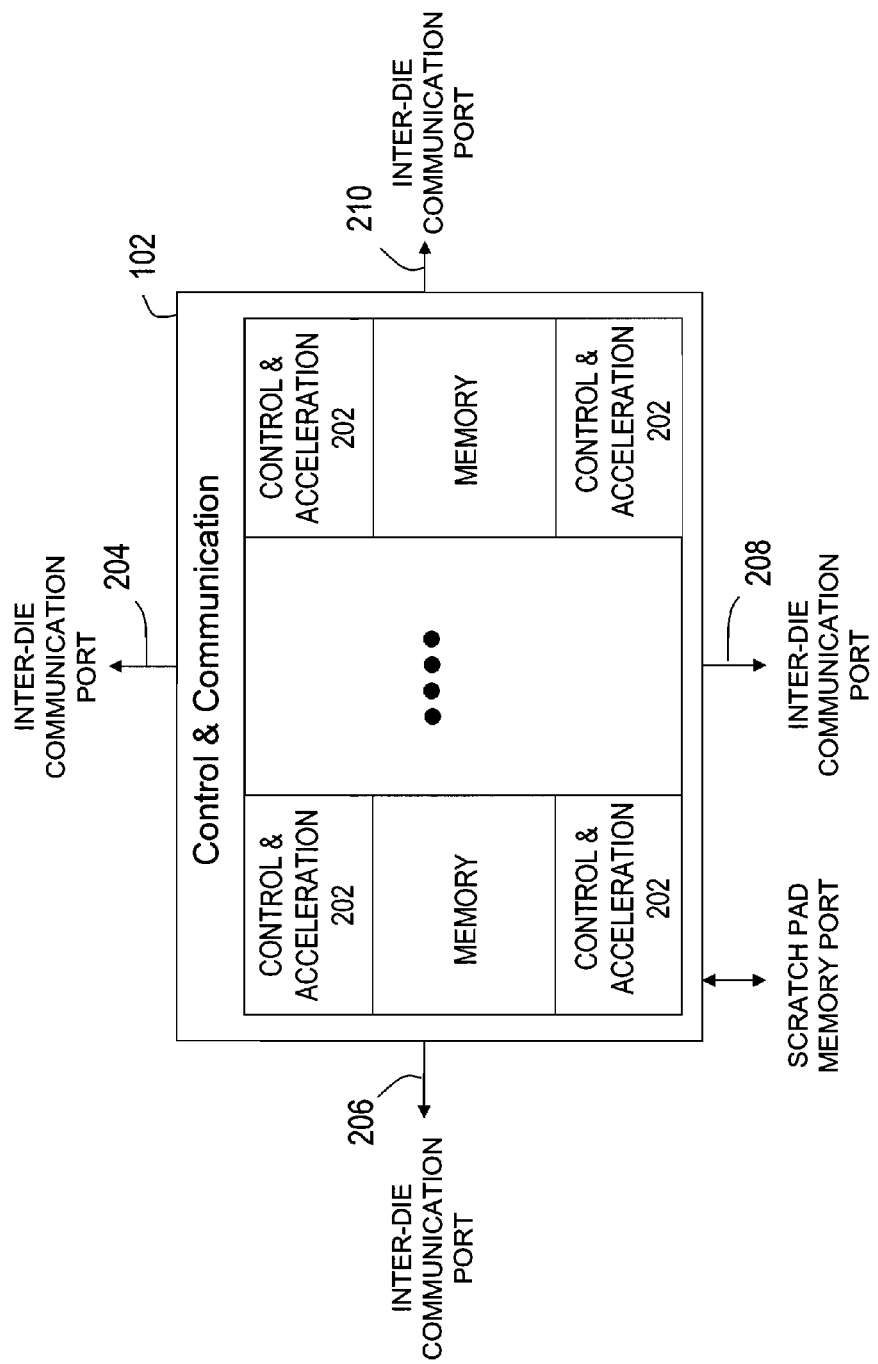
FIG. 2 is a simplified block representation of the autonomous memory device that makes possible the distributed sub-system.

FIG. 2 shows a simplified block representation of the autonomous memory device 102 that contains the computing nodes and acceleration hardware to provide computation and manipulation of the contents stored within memory. Distributed sub-system 10 includes multiple autonomous memory devices 102 with each device handling communications with neighboring die using inter-die communication ports 204, 206, 208, and 210. These inter-die communication paths allow autonomous communication among a large pool of die, perhaps thousands of die in distributed sub-system 10.

Autonomous memory device 102 includes both an operating system and processing capabilities, and is aware of the meaning of its contents. Put another way, device 102 is aware of the details where certain database tables are located, the field definitions for each of those tables, and how they're interlinked. Using this information, autonomous memory device 102 independently processes data in the stored database to get results that may be returned to the host processor.

Figure 3:
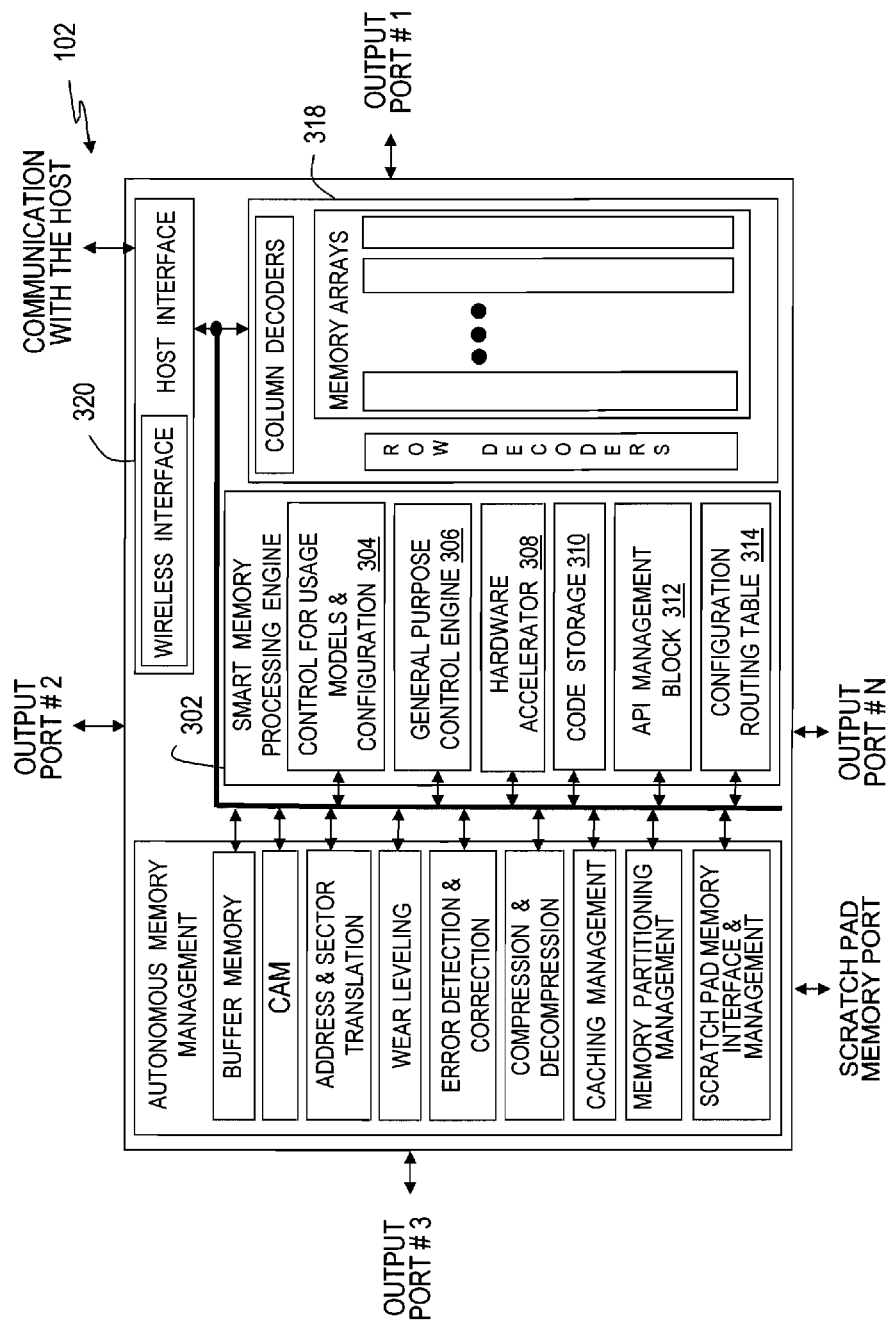
FIG. 3 illustrates one embodiment of the autonomous memory device in accordance with the present invention.

FIG. 3 shows one embodiment of functional blocks for the autonomous memory device 102 in accordance with the present invention. The autonomous memory device includes a smart memory processing engine 302 that provides control functions and processing acceleration 304 to enable usage models that involve computations and memory intensive operations within the smart memory. A general purpose control engine 306 is a microcontroller to receive downloaded end-user firmware or software to control other memory devices, among other functions. Control engine 306 may initiate instructions within the pool of autonomous memory and extract information from the pool that may be passed through a host interface 320 to a host controller. Protocols and algorithms allow for arbitration among devices, routing information to be passed among devices, and algorithms to be run to optimize the level of the pool.

A hardware accelerator 308 provides smart memory processing engine 304 with the acceleration hardware for computations and manipulations of the contents stored within memory 318. Hardware accelerator 308 is capable of handling matrix operations, simple comparisons with mask bits, memory copies and moves, etc. A code storage block 310 stores code downloaded from a host processor through host interface 320 for use by the general purpose control engine 306. An Application Programming Interface (API) management block 312 executes the stored routines and protocols provided by libraries or the operating system services in order to support the building of applications. The software API's are flexible and make use of knowledge of the underlying hardware to achieve optimal performance. A configuration routing table 314 keeps track of the other memory devices within distributed sub-system 10. The configuration of distributed sub-system 10 may be dynamically determined and the route table updated while autonomous memory device 102 operates within the system.

It is common to store data structures in a flat memory space. While there are an endless number of possible data structures, a few common structures such as, for example, matrices and linked lists can be used to illustrate how autonomous memory can be used to enhance memory functionality. Matrices cover a wide spectrum of domains including those arising from a wide variety of problems with underlying 2D or 3D geometries such as, for example, structural engineering, computational fluid dynamics, model reduction, semiconductor devices, thermodynamics, materials, acoustics, computer graphics/vision, robotics/kinematics, among others. Matrices may also cover applications that typically do not have such geometry such as optimization, circuit simulation, economic and financial modeling, theoretical and quantum chemistry, chemical process simulation, mathematics and statistics, power networks, and other networks and graphs.

In processing information stored in matrices, all or part of the matrices are read from memory 318 and computations are performed by hardware accelerator 308 on the contents of the matrices. In prior art systems large portions of the matrices were retrieved from the main memory and paged for storage in the processor cache. These matrices involve calculations that are iterative and may involve the entire matrices, so prior art systems can not store the entire contents required for processing into processor cache.

However, autonomous memory device 102 significantly improves the efficiency in executing matrix algorithms. Autonomous memory device 102 may store the matrices using a flat memory map and utilize a close coupling of memory 318 and embedded hardware accelerator 308 to greatly accelerate operations on these matrices. Matrix computations may further be enhanced by judiciously organizing matrices within distributed sub-system 10 to facilitate high performance matrix operations. As an example, commonly shared operands in an operation may be planned to advantageously reside within the same autonomous memory device 102 such that completion of these operations does not require communication with other devices.

It is common to create linked lists in a flat memory map to enable storage and manipulation of ordered sets of information. In traversing a linked list, it is generally required that each record be inspected to determine if it matches a pattern, or simply to obtain a pointer to the subsequent record. Using distributed sub-system 10, it is possible to parse linked lists with a minimum of host bus traffic. Then, each autonomous memory device 102 may inspect each record looking for specific patterns and find a pointer to the next record before repeating. Once results are found, autonomous memory device 102 uses host interface 320 to return pertinent results to the host.

Databases commonly comprise large data sets that are organized in groups of inter-linked tables. Index files are created and maintained, and utilized to accelerate searches for information in these tables. In prior art systems, some databases are larger than the near memory available to the processor operating on the databases and a significant portion of memory accesses may have long latency IO calls that gate system performance.

In contrast to the prior art systems, distributed sub-system 10 may have a very large number of autonomous memory devices 102 configured to communicate with each other and the host processor. The memory density found in distributed sub-system 10 may be limited primarily by the cost of the memory. Further, with control engine 306 embedded on the same die as memory 318, most operations would involve bus traffic internal to the memory die and limited traffic external to the memory die. Given the close coupling of a general purpose control engine 306 and the large density of memory 318, the bandwidth bottleneck caused by a processor accessing external memory may be eliminated. Simple hardware acceleration techniques in hardware accelerator 308 may be used to dramatically increase performance of distributed sub-system 10.

With distributed sub-system 10 designed for the specific purpose of manipulating memory content, a finite set of useful hardware primitives may be implemented. To implement a database in distributed sub-system 10, the database is transferred, all or in part, to the memory subsystem along with information about how the database is organized. Algorithms for processing information in the database are also downloaded. With the initialization process complete, the host generates very high level commands to distributed sub-system 10. Rather than reading and writing specific addresses to perform a higher level function, the host processor can issue a command like "parse table A to find all records matching a pattern, extract pointers to table B for each of these records, return fields a, b, c from table A and d and e from table B". All operations are run within distributed sub-system 10 and a short list of results is returned to the host processor.

Autonomous memory has a profound advantage in the case where a linear search is performed on a large database. By way of example, using pipelining for one autonomous memory device 102 having 1 GB memory density containing 8 banks of 2M pages of 64B each, a page can be compared to a target pattern at a beat rate of about 10 nsec per page resulting in a possible search time for the 1 GB die of about 20 mS. While this is an impressive result by itself, the value is that this solution is scalable, and thus, the search time for two autonomous memory devices 102 each having 1 GB memory density would also be about 20 mS as would the search time for a peta-byte of memory, or for any sized pool of memory. Using autonomous memory devices 102 in a distributed sub-system 10 to perform linear searches would be limited by the cost of the array of memory devices 102, along with thermal management and power constraints.

System administration functions may also take advantage of autonomous memory devices 102 in a distributed sub-system 10. For example, a data center may perform a virus scan on distributed sub-system 10 and when a virus is detected, the data center would be 'downed' for 20 mS during which time a search and destroy algorithm would be executed on every byte to isolate and disable any occurrence of the target virus.

Autonomous memory devices 102 in distributed sub-system 10 provide an advantage over prior art systems when executing the "Scatter/Gather" operations. "Scatter/Gather" operations provide a sequence of writes at different addresses that are compiled into a single composite instruction that is executed by the memory or IO subsystem. These operations are parsed and sent out to multiple die in distributed sub-system 10 at which point they are executed autonomously. The resulting status is accumulated and reported to the host when the entire operation is complete.

Autonomous memory devices 102 in distributed sub-system 10 are ideal for some classes of applications such as image processing. These classes are well suited to parallel computing where the image may be divided into many smaller segments which are processed relatively independently. After calculations on these small segments have been completed, then further calculations may be performed on groups of these segments to form a larger segment until the image is processed at a level encompassing the entire image.

Using autonomous memory devices 102, many or all of these low level calculations may be done in parallel at the level of a bank of the autonomous memory. Calculations crossing bank boundaries may be done within the one device, and by utilizing inter-die communication, higher level calculations may be done at the subsystem level. Other parallel computing tasks follow a similar model and may involve iteration to refine accuracy of results or to step the simulation through time.

Distributed sub-system 10 provides interaction beyond the expected read and write operations that are enabled by memory storage devices. Autonomous memory device 102 interacts with the existing computing infrastructure using one or more interfaces that allow communication both with the host computer and with the network. From the host computer's perspective, the interaction may be a memory or block interface but to the autonomous memory device 102 a flexible interface is provided on top of which software APIs may be built. These APIs may be scaled to either expose functionality to the host system or provide a way of passing on the request among other autonomous memory devices.

The autonomous memory device 102 interface to other devices in distributed sub-system 10 provides a way of passing messages that may contain a command and a list of parameters. The parameters may contain actual data, addressing information that refers to data in the array, and object identifiers that reference an object located in the array. Parameters may also contain or refer by address or object identification (Object ID) to the code required to operate on a given data set. The code passed into autonomous memory device 102 may fit the paradigm established by the OpenCL standard, possibly MapReduce. Many of the existing clustering and "cloud-computing" infrastructure pieces may be reusable within distributed sub-system 10.

The memory controller or an autonomous memory device 102 in distributed sub-system 10 can perform condition monitoring to determine bus activities due to data transfers between the memory devices. Based on the monitored results, a re-allocation of resources can be dynamically executed to improve system performance. By way of example, after monitoring the traffic within distributed sub-system 10, it may be determined that high bandwidth traffic commonly occurs between two memory devices. If these memory devices are not neighboring devices the subsystem may select one of these memory devices and relocate the contents of the other memory device to allow a single autonomous memory device 102 to provide the processing that completes the algorithm. Alternatively, the memory contents of relatively distant devices may be redistributed to near-by nodes to reduce bus traffic.

Further, searches of distributed sub-system 10 for read-only content may cause a subset of the network to be constantly active. In this case, the subsystem may replicate the contents in this portion of the network so that multiple autonomous memory devices 102 can perform parallel operations on the read-only content within distributed sub-system 10.

By now it should be apparent that embodiments of the present invention allow increased memory storage efficiencies through autonomous data storage. By connecting the autonomous memory device in a distributed memory subsystem a host can download a database to the autonomous memory device. The autonomous memory device can initiate instructions to disperse portions of the database to neighboring die using an interface to handle inter-die communication within a pool of autonomous memory. The autonomous memory device can then extract information from the pool of autonomous memory that is passed through the host interface to the host controller.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An autonomous memory sub-system, comprising:
a controller having a condition monitoring block;
first and second autonomous memory devices having bus traffic wherein the first autonomous memory device includes a die including a memory in the die to store contents and a control engine embedded in the same die with the memory, the condition monitoring block monitors the bus traffic and based on monitored results re-allocates resources to dynamically improve system performance, the first autonomous memory device including a first inter-die communication port physically coupled to a die of the second autonomous memory device to communicate with the die of the second autonomous memory device, and the first autonomous memory device including a second inter-die communication port physically coupled to a die of an additional autonomous memory device to communicate with the die of the additional autonomous memory device different from the first and second autonomous memory devices; and
a third autonomous memory device that is not a neighboring device to the first and second autonomous memory devices, wherein the controller selects contents of the third autonomous memory device to relocate to the first and second autonomous memory devices that are neighboring devices, and the first, second, and third autonomous memory devices further include a scratch pad memory port to couple external memory.

2. The autonomous memory sub-system of claim 1 wherein read-only content distributed within the first, second and third autonomous memory devices is replicated in the first and second autonomous memory devices to perform parallel operations on the read-only content without incurring bus traffic by the third autonomous memory device.

3. The autonomous memory sub-system of claim 1 wherein the controller selects to relocate contents of the second autonomous memory device to the first autonomous memory device to reduce bus traffic between the first and second autonomous memory devices.

4. The autonomous memory sub-system of claim 1 wherein the external memory is NAND memory or Dynamic Random Access Memory (DRAM).

5. An autonomous memory sub-system, comprising:
a memory device in an array of memory devices to initiate instructions to disperse portions of a database neighboring memory devices; and
a condition monitoring block to monitor bus traffic in the autonomous memory sub-system and re-allocate memory content in the array of memory devices to dynamically reduce bus traffic of the memory device to the neighboring memory devices, the memory device including a first inter-die communication port physically coupled to a die of a first memory device of the neighboring memory devices to communicate with the die of the first memory device of the neighboring memory devices, and the memory device including a second inter-die communication port physically coupled to a die of a second memory device of the neighboring memory devices to communicate with the die of the second memory device of the neighboring memory devices, wherein the memory device in the array of memory devices further includes a scratch pad memory port to couple external NAND memory and Dynamic Random Access Memory (DRAM).

6. The autonomous memory sub-system of claim 5 wherein the memory device in an array of memory devices has four output ports physically coupled to four respective dies of four neighboring memory devices to communicate with at least four neighboring memory devices.

7. The autonomous memory sub-system of claim 5 wherein the memory device in an array of memory devices communicates wirelessly with the at least four neighboring memory devices.

8. The autonomous memory sub-system of claim 5 wherein the condition monitoring block re-allocates memory content in the memory device in an array of memory devices after having determined neighboring memory devices from non-neighboring memory devices.

9. The autonomous memory sub-system of claim 8 wherein read-only content distributed within the memory sub-system is replicated in the memory device in an array of memory devices and the neighboring memory devices to perform parallel operations on the read-only content without incurring bus traffic by the non-neighboring memory devices.

10. An autonomous memory sub-system having an array of memory devices, wherein a memory device in the array includes a die including a memory in the die to store contents and a control engine embedded in the same die with the memory, the memory device in the array initiates instructions to disperse portions of a database to memory devices in the array and directs re-allocation of memory content to dynamically manage constrained resources, the memory device includes a first inter-die communication port physically coupled to a die of a first memory device among the array of memory devices to communicate with the die of the first memory device among the array of memory devices, and the memory device includes a second inter-die communication port physically coupled to a die of a second memory device among the array of memory devices to communicate with the die of the second memory device among the array of memory devices, wherein the memory device in the array includes a scratch pad memory port to couple external memory.

11. The autonomous memory sub-system of claim 10 wherein the constrained resources includes a bus bandwidth.

12. The autonomous memory sub-system of claim 10 wherein the memory contents of non-neighboring devices in the array is redistributed to neighboring devices to optimize the constrained resources.

* * * * *